(12) United States Patent
Shin et al.

(10) Patent No.: US 8,737,528 B2
(45) Date of Patent: May 27, 2014

(54) MULTIPORT AMPLIFIER AND MULTIPORT AMPLIFICATION METHOD USING THE SAME

(75) Inventors: Dong-Hwan Shin, Daejeon-si (KR); Seong-Mo Moon, Daejeon-si (KR)

(73) Assignee: Electronics and Telecommunications Research Institute, Daejeon-Si (KR)

( * ) Notice: Subject to any disclaimer, the term of this patent is extended or adjusted under 35 U.S.C. 154(b) by 211 days.

(21) Appl. No.: 13/334,036

(22) Filed: Dec. 21, 2011

(65) Prior Publication Data

US 2012/0163428 A1 Jun. 28, 2012

(30) Foreign Application Priority Data

Dec. 22, 2010 (KR) .................. 10-2010-0132724

(51) Int. Cl.
*H04L 27/00* (2006.01)

(52) U.S. Cl.
USPC .......................................................... 375/297

(58) Field of Classification Search
USPC .................................................. 375/297, 296
See application file for complete search history.

(56) References Cited

U.S. PATENT DOCUMENTS

2010/0156528 A1    6/2010    Couchman et al.

OTHER PUBLICATIONS

P. James, "Optimization of a Multi-port Amplifier Using a Least Squares Evolutionary Relaxation Method", Proceedings of the 36th European Microwave Conference, pp. 886-889, Sep. 2006.

*Primary Examiner* — Kevin Kim
(74) *Attorney, Agent, or Firm* — Rabin & Berdo, P.C.

(57) ABSTRACT

A multiport amplifier having an output power control function is provided. The multiport amplifier includes a small-sized, low-power auto-calibrating circuit and is used for a communication satellite relay system.

17 Claims, 17 Drawing Sheets

MULTIPORT AMPLIFIER AND MULTIPORT AMPLIFICATION METHOD USING THE SAME

CROSS-REFERENCE TO RELATED APPLICATION

This application claims the benefit under 35 U.S.C. §119(a) of Korean Patent Application No. 10-2010-0132724, filed on Dec. 22, 2010, the disclosure of which is incorporated by reference in its entirety for all purposes.

BACKGROUND

1. Field

The following description relates to a multiport amplifier, which is used for a communication satellite relay system and functions to control output power, and more particularly, to a multiport amplifier capable of automatically calibrating phase and amplitude mismatches caused in circuit configuration and environment.

2. Description of the Related Art

A multi-beam antenna system capable of providing narrow beams having a high antenna gain within service coverage has widely been employed as a payload system of communication and broadcasting satellites because the multi-beam antenna system has excellent effective isotropic radiated power (EIRP) and a high gain-to-noise temperature ratio (G/T).

A multi-beam antenna system has broadly adopted a multiport amplifier capable of controlling output power based on operation conditions. The multi-beam antenna system using the multiport amplifier may provide communication and broadcasting services using multiple spot beams within service coverage. The multi-beam antenna system may flexibly allocate high power to a region that requires higher EIRP due to a rainfall or a jump in communication service.

In addition, since high-power amplifiers, which may have the highest failure rate among components for satellite relay systems, are used in parallel, the multi-beam antenna system may be configured using a smaller number of high-power amplifier redundancy units than a conventional satellite relay system.

Operating principles of a multiport amplifier may be established only when connection components, such as hybrids, high-power amplifiers, and other transmission lines, perform ideal operations. When an actual multiport amplifier is embodied, there may be a difference in output powers of the hybrids, and an error in phase may occur.

In the high-power amplifiers, an output signal may have a different phase according to the magnitude of input power due to nonlinearity. When connection components, such as transmission lines, are not manufactured to have the same size and shape, variations in the magnitude and phase of signals may occur.

To recover the variations in the magnitudes and phases of the signals, a magnitude/phase adjusting circuit may determine magnitudes and phases of signals so that a multiport amplifier system is configured to optimize actual performance of the respective components when a multiport amplifier system is implemented.

However, when the performance of components constituting the multiport amplifier system varies due to variations in environmental conditions, such as degradation of the components or a variation in temperature, the multiport amplifier cannot remain optimized in terms of performance.

SUMMARY

The following description relates to a circuit and method for setting phase/amplitude adjustment values in a multiport amplifier.

The following description relates to a multiport amplifier having an auto-calibration function.

The following description relates to a multiport amplifier capable of automatically calibrating phase and amplitude mismatch in circuit configuration and environment.

Furthermore, the following description relates to a multiport amplifier including a small-sized, low-power auto-calibrated circuit.

According to an exemplary aspect, there is provided a multiport amplifier, which is optimized in terms of performance according to variations in environmental conditions. The multiport amplifier, which is configured to control output power of a multi-beam antenna system, includes: a magnitude/phase adjusting circuit configured to adjust a magnitude of a signal and an error in phase caused by nonlinearity of an input or output hybrid network constituting the multiport amplifier; and a calibrating circuit configured to control the magnitude/phase adjusting circuit such that the magnitude and phase of a signal actually output by each of output ports of the multiport amplifier are equal to the magnitude and phase of a signal output by each of the output ports, which is predicted from an input signal input to a specific input port of the multiport amplifier.

The calibrating circuit may include: a quadrature phase shift keying (QPSK) modulator configured to modulate a pilot signal into a QPSK signal; a signal-selected demodulator configured to combine the modulated QPSK signal and the signal output by each of the output ports, and output a demodulation signal; and a signal processor configured to compare the output signal predicted from the input signal with the demodulated output signal, and transmit a control signal by which the magnitude/phase adjusting circuit adjusts the magnitude and phase of the demodulated output signal.

The QPSK demodulator may modulate a pilot signal input to the input port into a QPSK signal including I and Q signals, and transmit the modulated QPSK signal to the signal-selected demodulator.

The signal-selected demodulator may include a switch configured to sequentially switch the output signal output by each of the output ports; a signal coupler configured to shift the switched output signal in phase, and couple the modulated QPSK signal with the phase-shifted switched output signal; and a comparator configured to compare the modulated QPSK signal with the phase-shifted switched output signal, and output a difference signal corresponding to a difference between the two signals.

The switch may switch an output signal sequentially having a predetermined phase with respect to the output signal output by each of the output ports.

When the input signal is input to the specific input port of the multiport amplifier, the switch may receive at least one signal from a transmission path of the predicted output signal over the output hybrid network, and switch the received signal according to the phase of the received signal.

When the multiport amplifier includes four input ports and four output ports, the switch may receive six signals from the transmission path of the output signal over the output hybrid network, and switch the received six signals according to phases of the received six signals.

The signal coupler may include: a first coupler configured to couple the modulated QPSK signal with the switched output signal; a phase shifter configured to invert a phase of the switched output signal by +180°; and a second coupler configured to couple the modulated QPSK signal with the output signal shifted in phase by the phase shifter.

The signal coupler may include: a first port to which the modulated QPSK signal is input; a second port to which the switched output signal is input; a third port from which a signal generated by the first coupler is output; and a fourth port from which a signal generated by the second coupler is output.

In addition, the signal coupler may be embodied using a rat-race coupler as a passive device or an active transistor.

The multiport amplifier may further include: a power detector configured to detect power of each of a signal generated by the first coupler and a signal generated by the second coupler, and generate power signals; and a filter unit configured to remove a harmonic component and noise of the generated power signal.

The comparator may compare the power signal of the signal generated by the first coupler with the power signal of the signal generated by the second coupler, and output a difference signal corresponding to a difference between the two power signals.

The signal processor may generate a control signal by which the magnitude/phase adjusting circuit adjusts the magnitude and phase of the difference signal based on the output signal predicted from the input signal, and transmit the control signal to the magnitude/phase adjusting circuit.

Furthermore, the signal processor may generate a control signal by which the magnitude and phase of the difference signal corresponding to each of the signals received by the switch are adjusted, and transmit the control signal to the magnitude/phase adjusting circuit.

In addition, the signal processor may generate a control signal by which the magnitude and phase of the difference signal corresponding to each of the six signals received by the switch are adjusted, and transmit the control signal to the magnitude/phase adjusting circuit.

The magnitude/phase adjusting circuit may adjust the magnitude and phase of the difference signal in response to the received control signal.

According to another exemplary aspect, there is provided a multiport amplification method, which may optimize performance according to variations in environmental conditions. The multiport amplification method may use a multiport amplifier configured to control output power in a multi-beam antenna system. The method includes modulating a pilot signal input to a specific input port of the multiport amplifier into a QPSK signal including I and Q signals; sequentially switching output signals output by respective output ports of the multiport amplifier; coupling the modulated QPSK signal with the switched output signal; coupling the modulated QPSK signal with an output signal obtained by inverting the switched output signal in phase by +180°; comparing the two coupled signals to output a difference signal corresponding to a difference between the compared signals; and adjusting the magnitude and phase of the difference signal based on an output signal predicted from the input pilot signal.

When an input signal is input to a specific input port of the multiport amplifier, each step may be repeatedly performed on at least one signal output from a transmission path of the predicted output signal over an output hybrid network.

Other objects, features and advantages will be apparent from the following description, the drawings, and the claims.

BRIEF DESCRIPTION OF THE DRAWINGS

Elements, features, and structures are denoted by the same reference numerals throughout the drawings and the detailed description, and the size and proportions of some elements may be exaggerated in the drawings for clarity and convenience.

DETAILED DESCRIPTION

The detailed description is provided to assist the reader in gaining a comprehensive understanding of the methods, apparatuses and/or systems described herein. Various changes, modifications, and equivalents of the systems, apparatuses, and/or methods described herein will likely suggest themselves to those of ordinary skill in the art. Also, descriptions of well-known functions and constructions are omitted to increase clarity and conciseness.

Figure 1:
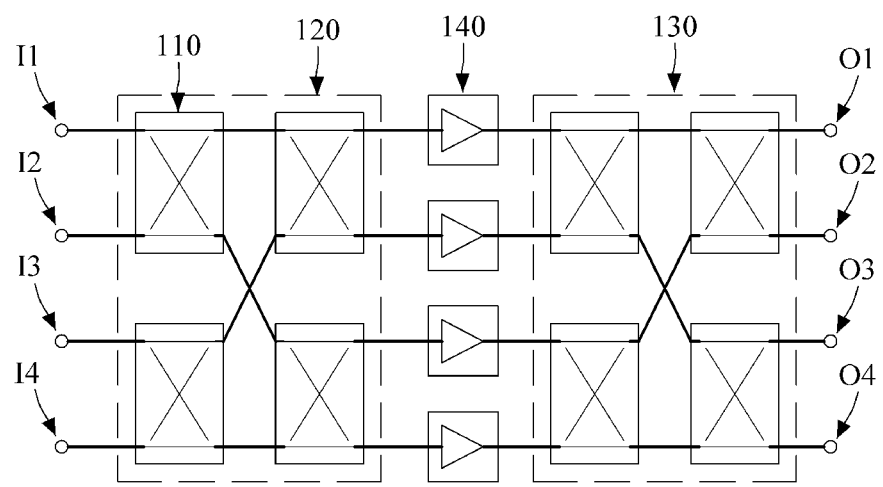
FIG. 1 is a conceptual diagram of a 4×4 multiport amplifier according to an exemplary embodiment of the present invention.

FIG. 1 is a conceptual diagram of a 4×4 multiport amplifier according to an exemplary embodiment of the present invention.

A multiport amplifier may include a plurality of input ports and a plurality of output ports, and the number of input and output ports may be 2n. Thus, although multiport amplifiers having 2, 4, 8, 16, . . . input and output ports may be configured, 4×4 and 8×8 multiport amplifiers may be most frequently used in consideration of simplicity of configuration and optimum performance.

Referring to FIG. 1, the multiport amplifier may include input and output hybrid networks 120 and 130, each hybrid network including four hybrids 110, and four high-output amplifiers 140 configured to connect the two hybrid networks 120 and 130.

Figure 2:
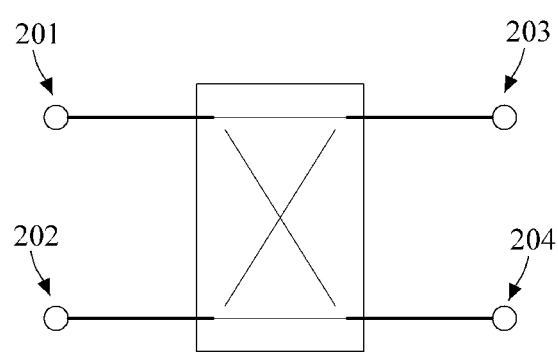
FIG. 2 is a diagram of a hybrid constituting input/output hybrid networks of a multiport amplifier according to an exemplary embodiment of the present invention.

FIG. 2 is a diagram of a hybrid constituting input and output hybrid networks of a multiport amplifier according to an exemplary embodiment of the present invention.

When a radio-frequency (RF) signal is applied to an input port 201 of the hybrid, a magnitude of the applied signal may be divided in half and output to ports 203 and 204, and no signal may be output to a port 202.

Although the output signals output to the ports 203 and 204 have the same magnitude, the output signals may have a phase difference of 90°. The multiport amplifier may operate using the above-described characteristics of the hybrid.

FIGS. 3A through 3D are signal flow diagrams showing operation principles of a 4×4 multiport amplifier according to an exemplary embodiment of the present invention.

Figure 3A:
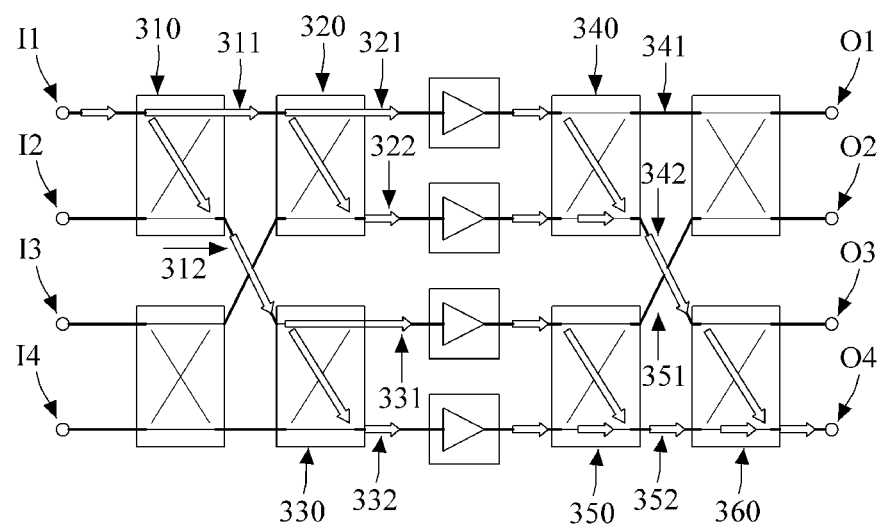
FIGS. 3A through 3D are signal flow diagrams showing operation principles of a 4×4 multiport amplifier according to an exemplary embodiment of the present invention.

FIG. 3A shows a case where it is assumed that a signal having a frequency f1 is applied to an input port I1 of a multiport amplifier.

The applied signal may pass through a hybrid 310 and be dividedly output to ports 311 and 312, and the two output signals may have a phase difference of 90° therebetween.

The signal applied to the port 311 may be applied to a hybrid 320 and dividedly output to ports 321 and 322 so that the two output signals have a phase difference of 90° therebetween.

Although the signals applied to the ports 321, 322, 331, and 332 have the same magnitude, the signals may sequentially have phase differences of 0°, 90°, 90°, and 180° therebetween. Each of the signals applied to the ports 321, 322, 331, and 332 may be applied through a high-power amplifier to an output hybrid network.

Two signals applied to a hybrid 340 may have the same magnitude and phases of 0° and 90°, respectively, and there may be a phase difference of 90° between the two signals applied to the hybrid 340. Thus, two signals having opposite phases may be output from a port 341 and combined with each other and cancel out each other, while a sum signal obtained by combining signals having the same phase of 90° may be output from a port 342.

Two signals applied to a hybrid 350 may have the same magnitude and phases of 90° and 180°, respectively, and there may be a phase difference of 90° between the two signals applied to the hybrid 350. Thus, two signals having opposite phases may be output from a port 351 and combined with each other and cancel out each other, while a sum signal obtained by combining signals having the same phase of 180° may be output from a port 352.

In a hybrid 360, a signal obtained by combining the signal output from the port 342 and the signal output from the port 352 may be output to a port O4 and have a phase of 180°. In conclusion, a signal input to a port I1 of the 4×4 multiport amplifier may be output only through the port O4, and the signal input to the port I1 and the signal output through the port O4 may have a phase difference of 180°.

Figure 3B:
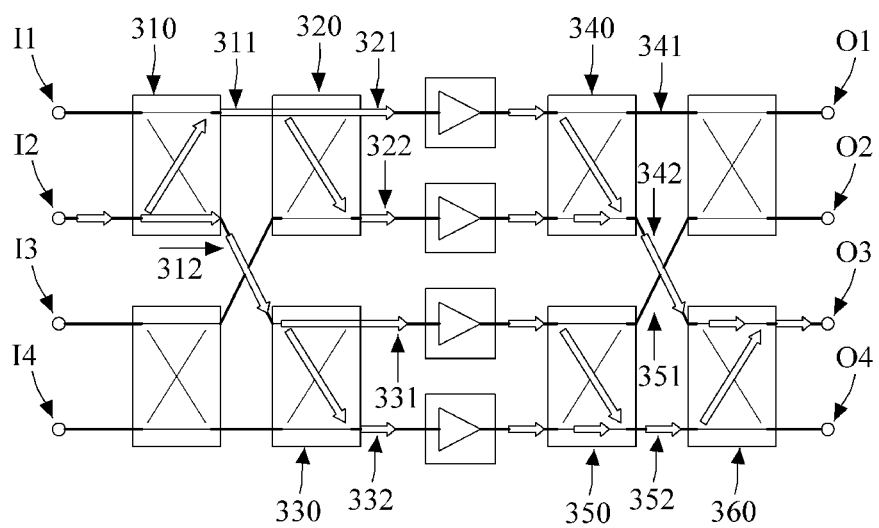
Figure 3C:
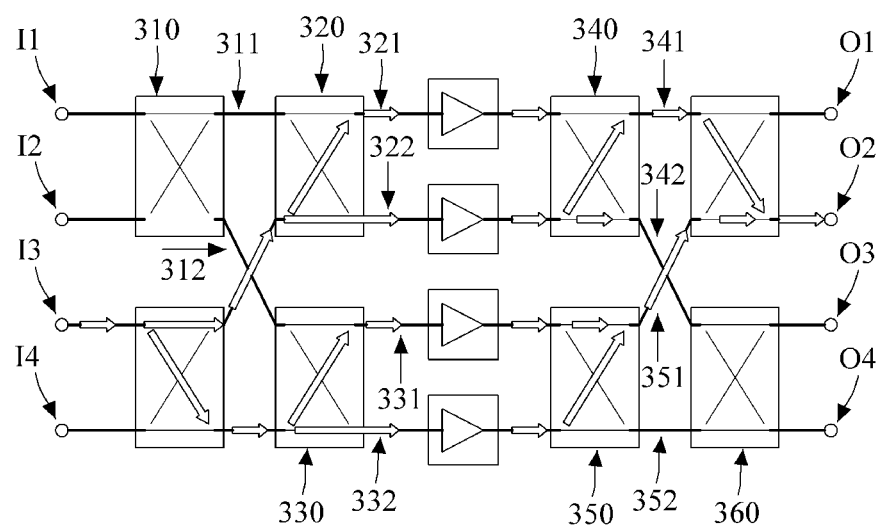
Figure 3D:
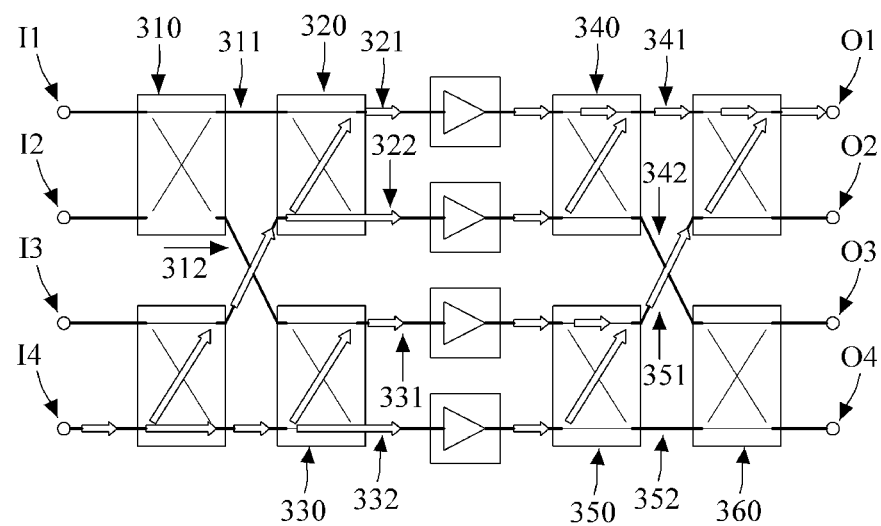

Referring to each of FIGS. 3B through 3D, a signal may be output from an input port through one output port using the same process as in FIG. 3A.

Specifically, FIG. 3B shows a case where it is assumed that a signal having a frequency f2 is applied to an input port I2 of a multiport amplifier. The signal input to the port I2 may be output only through a port O3, and the signal input to the port I2 and the signal output through the port O3 may have a phase difference of 180°.

In this case, although signals applied to the ports 321, 322, 331, and 332 have the same magnitude, the signals may sequentially have phase differences of 0°, 90°, 270°, and 0° therebetween. Each of the signals applied to the ports 321, 322, 331, and 332 may be applied through a high-power amplifier to an output hybrid network.

FIG. 3C shows a case where it is assumed that a signal having a frequency f3 is applied to an input port I3 of a multiport amplifier. The signal input to the port I3 may be output only through a port O2, and the signal input to the port I3 and the signal output through the port O2 may have a phase difference of 180°.

In this case, although signals applied to the ports 321, 322, 331, and 332 have the same magnitude, the signals may sequentially have phase differences of 0°, 270°, 90°, and 0° therebetween. Each of the signals applied to the ports 321, 322, 331, and 332 may be applied through a high-power amplifier to an output hybrid network.

FIG. 3D shows a case where it is assumed that a signal having a frequency f4 is applied to an input port I4 of a multiport amplifier. The signal input to the port I4 may be output only through a port O1, and the signal input to the port I4 and the signal output through the port O1 may have a phase difference of 180°.

In this case, although signals applied to the ports 321, 322, 331, and 332 have the same magnitude, the signals may sequentially have phase differences of 0°, 270°, 270°, and 180° therebetween. Each of the signals applied to the ports 321, 322, 331, and 332 may be applied through a high-power amplifier to an output hybrid network.

Figure 4:
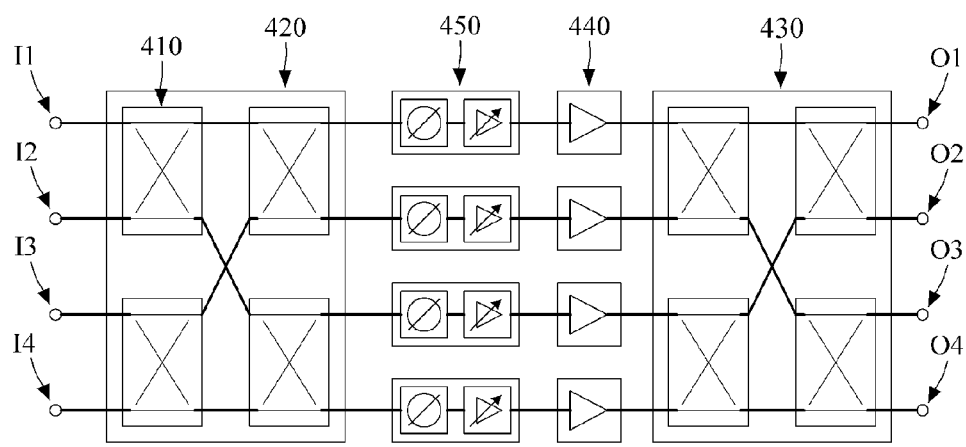
FIG. 4 is a diagram of a multiport amplifier including a magnitude/phase adjusting circuit according to an exemplary embodiment of the present invention.

FIG. 4 is a diagram of a multiport amplifier including a magnitude/phase adjusting circuit according to an exemplary embodiment of the present invention.

Referring to FIG. 4, a magnitude/phase adjusting circuit 450 may enable a fine calibration operation and a coarse calibration operation. The coarse calibration operation may include inverting a phase by 0° or 180° to change a port position of an output signal. The fine calibration operation may include calibrating a phase based on a node connected to each component and mismatch characteristics.

As shown in FIGS. 3A through 3D, input and output ports of the multiport amplifier may be previously determined, and magnitudes and phases of signals input/output to/from the input and output ports may be predictable.

However, errors in magnitudes and phases of signals may occur due to mismatch among respective components constituting a multiport amplifier. Also, unlike in predictable ideal operations, equal-phase or opposite-phase conditions between divided signals in an input hybrid network and an output hybrid network may not be satisfied, thereby degrading isolation performance between input and output ports of the multiport amplifier.

For these reasons, the multiport amplifier may be manufactured to include the magnitude/phase adjusting circuit 450 as shown in FIG. 4. To prevent power loss of an output port, the magnitude/phase adjusting circuit 450 may be disposed at a front end of a high-power amplifier 440. Also, the magnitude/phase adjusting circuit 450 may maintain a magnitude and phase of a signal in an output hybrid network 430 of the multiport amplifier as in an ideal multiport amplifier, and improve isolation performance of the multiport amplifier.

An input hybrid network 420 shown in FIG. 4 may include four hybrids 410 and have the same function and configuration as in FIG. 1.

Figure 5:
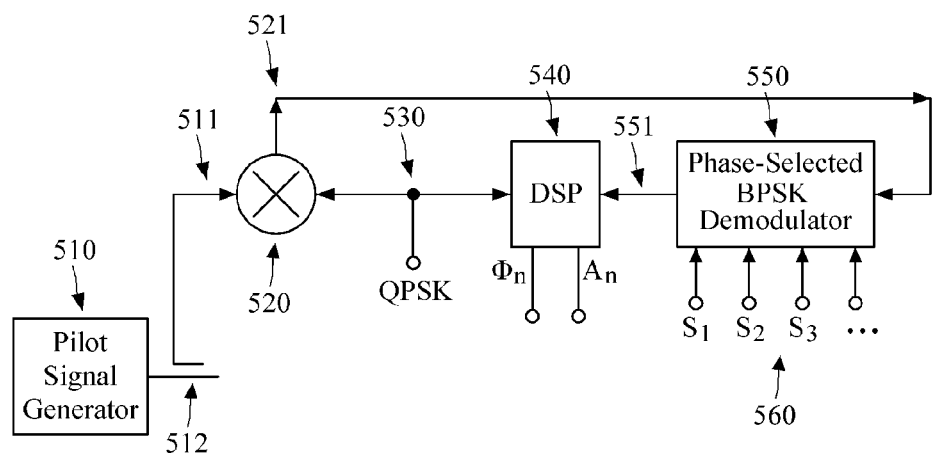
FIG. 5 is a construction diagram of a phase/amplitude mismatch calibrating circuit required for an auto-calibration function of a multiport amplifier according to an exemplary embodiment of the present invention.

FIG. 5 is a construction diagram of a phase/amplitude mismatch calibrating circuit required for an auto-calibration function of a multiport amplifier according to an exemplary embodiment of the present invention.

FIG. 5 shows the phase/amplitude mismatch calibrating circuit for an auto-calibration function system according to an exemplary embodiment of the present invention.

Referring to FIG. 5, the phase/amplitude mismatch calibrating circuit may include a pilot signal generator 510, a QPSK modulator 520, a signal-selected binary-phase-shift-keying (BPSK) demodulator 550, and a digital signal processor (DSP) 540.

The pilot signal generator 510 may generate a pilot signal.

The QPSK modulator 520 may modulate the pilot signal into a quadrature phase shift keying (QPSK) signal.

The signal-selected BPSK demodulator 550 may combine the modulated QPSK signal and an output signal output by each of output ports, and demodulate only one path signal of an I signal and a Q signal of the QPSK signal.

The DSP 540 may compare an output signal predicted from the input pilot signal with the demodulated output signal, and transmit a control signal by which a magnitude/phase adjusting circuit adjusts the magnitude and phase of the demodulated output signal.

Figure 6:
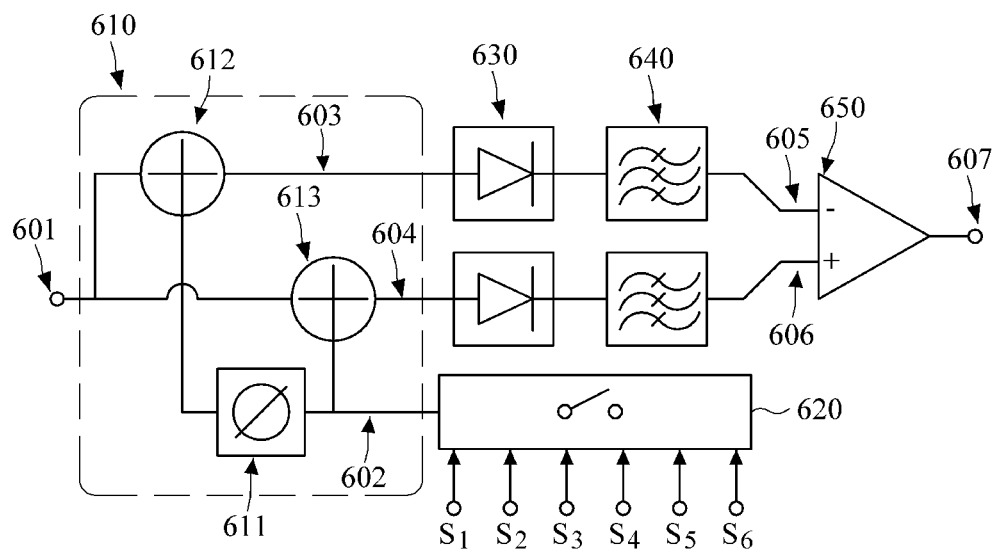
FIG. 6 is a detailed construction diagram of a signal-selected demodulator included in the phase/amplitude mismatch calibrating circuit according to the exemplary embodiment of the present invention.

FIG. 6 is a detailed construction diagram of the signal-selected demodulator 550 included in the phase/amplitude mismatch calibrating circuit of FIG. 5.

Referring to FIG. 6, the signal-selected demodulator 550 may include a PSK demodulator 610, 630, 640, and 650, and a switch 620.

The PSK demodulator 610, 630, 640, and 650 may include a phase shifter 611, signal couplers 612 and 613, a power detector 630, a filter 640, and a comparator 650. By use of the above-described configuration, a signal obtained by changing the magnitude and phase of a signal output from an output port may be obtained.

In a direct conversion demodulator using a typical multiplicative mixing method or a multiport receiver, an I/Q signal path of a mixer may be separated from an I/Q signal path of a parallel-to-serial (P/S) converter.

In other words, synchronous detection of a typical QPSK signal may include correlating an input modulation signal with a local oscillator (LO) signal having a phase difference of 90° from the input modulation signal to determine a value most similar to symbol [±1, ±1].

Afterwards, a P/S converter may convert the symbol into a 2-bit value to recover original base-band binary data. Thus, to receive the QPSK modulation signal, I and Q signals may be generated from the LO signal, separated from each other and transmitted to I and Q paths, respectively, and the modulation signal may be demodulated using a mixer.

However, the configuration of FIG. 6 may selectively recover specific data out of desired I± and Q± signals according to the phase of an input signal input to a switch end. Accordingly, as compared with a conventional configuration, not only the size of a circuit but also power consumption may be halved.

Furthermore, due to the recovery of the selected signal, the DSP 540 may compare a signal having a specific phase output from each of output ports of FIG. 4 with a modulation signal, and calibrate mismatch caused in the multiport amplifier shown in FIG. 1.

A basic operation principle of each configuration will now be described. A detailed description of a process of calibrating a phase and amplitude of an output signal will now be presented.

The QPSK modulator 520 of FIG. 5 may modulate a pilot LO signal into a QPSK modulation signal. The signal-selected demodulator 550 may combine the modulated pilot signal with an output signal of each node whose phase and amplitude is to be de verified, and output a demodulation signal.

The demodulation signal may pass through a comparator and be compared with a signal corresponding to each phase of the QPSK signal by a DSP so that the phase of the output signal may be calibrated until a desired output amplitude is obtained.

Figure 7:
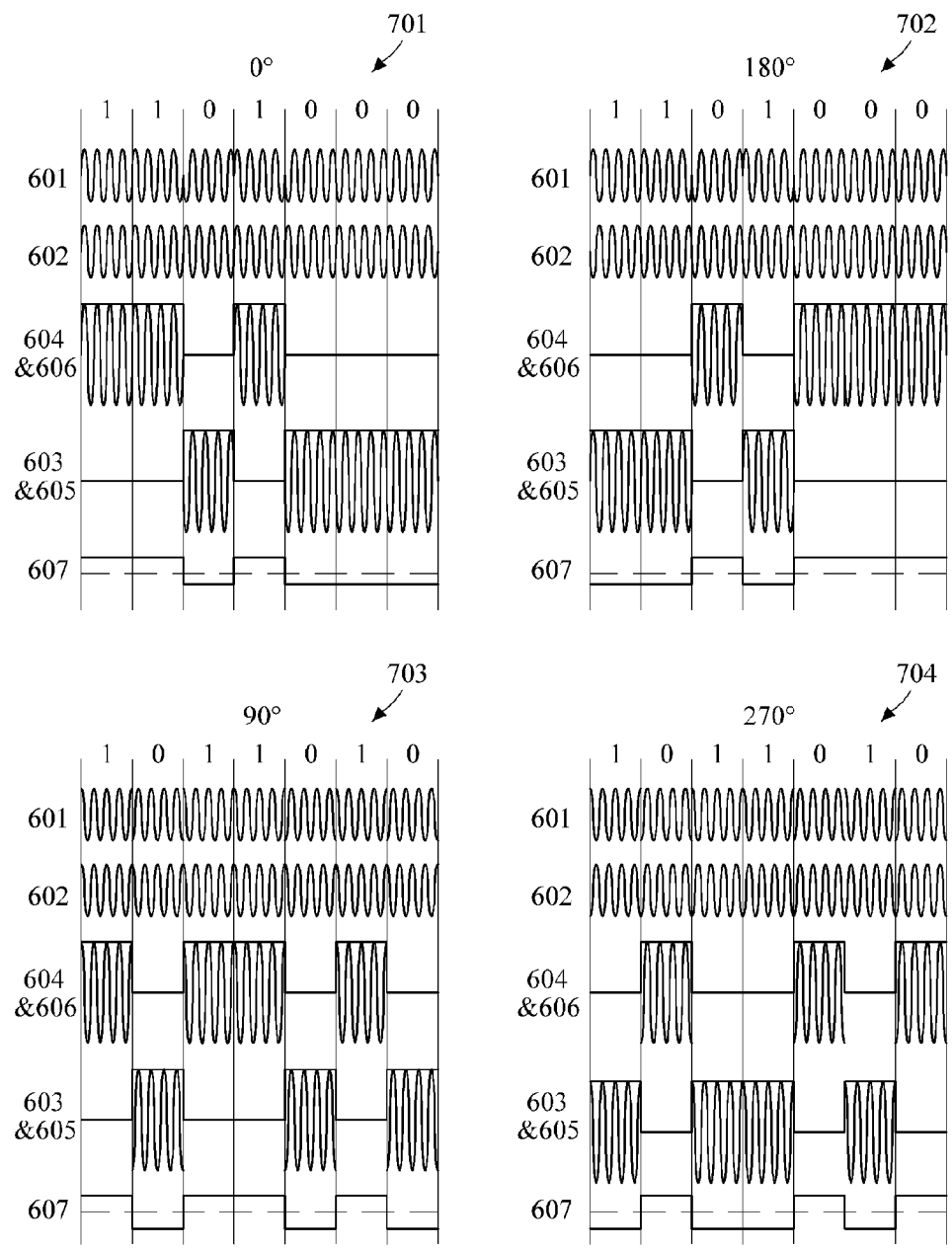
FIG. 7 shows time domain curves of a detailed construction of the signal-selected demodulator according to the exemplary embodiment of the present invention.

FIG. 7 shows time domain curves of the detailed construction of the signal-selected demodulator 550 according to the exemplary embodiment of the present invention.

FIG. 7 shows time domains with respect to phases of output signals when the signal-selected BPSK demodulator 550 having the detailed construction of FIG. 6 receives output signals having different phases from the switch 620.

A first curve 701 of FIG. 7 shows output results of respective nodes when there is a phase difference of 0° between a signal of a node 601 and a signal of a node 602. Each of the remaining curves 702, 703, and 704 of FIG. 7 shows output results of respective nodes of the signal-selected demodulator 550 according to the phase difference between the signals of the nodes 601 and 602.

As a result, a signal finally output from the signal-selected BPSK demodulator 550 may be output through a node 607, and applied to the DSP 540 through a line 551 shown in FIG. 5.

Figure 8:
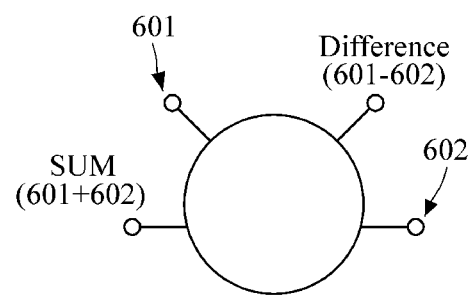
FIG. 8 is a diagram of a rat race coupler that embodies a power coupler using a passive device according to an exemplary embodiment of the present invention.

FIG. 8 is a diagram of a rat race coupler that embodies a power coupler using a passive device according to an exemplary embodiment of the present invention.

A rat-race coupler may combine or split signals having the same frequency. A rat-race coupler used in the present invention may embody the BPSK demodulator 610 of FIG. 6.

Assuming that a signal input to the node 602 has a phase of 0°, the phase of the signal of the node 601 of FIG. 6 may be shifted by 180° by a 180-degree phase shifter 611. Also, when each of signals having phases of 0° and 180° is combined with the signal of the node 601, signals of the nodes 603 and 604 may be output.

In other words, a sum signal corresponding to the sum of the signals of the nodes 601 and 602 may be output through the node 604, while a difference signal corresponding to a difference between the signals of the nodes 601 and 602 may be output through the node 603. This description may be understood with reference to the rat-race coupler shown in FIG. 8.

Accordingly, signals 605 and 606 may pass through the power detector 630 and the filter 640 as shown in FIG. 7, and two detected demodulation signals 605 and 606 may be shifted in phase by 180°.

Figure 9:
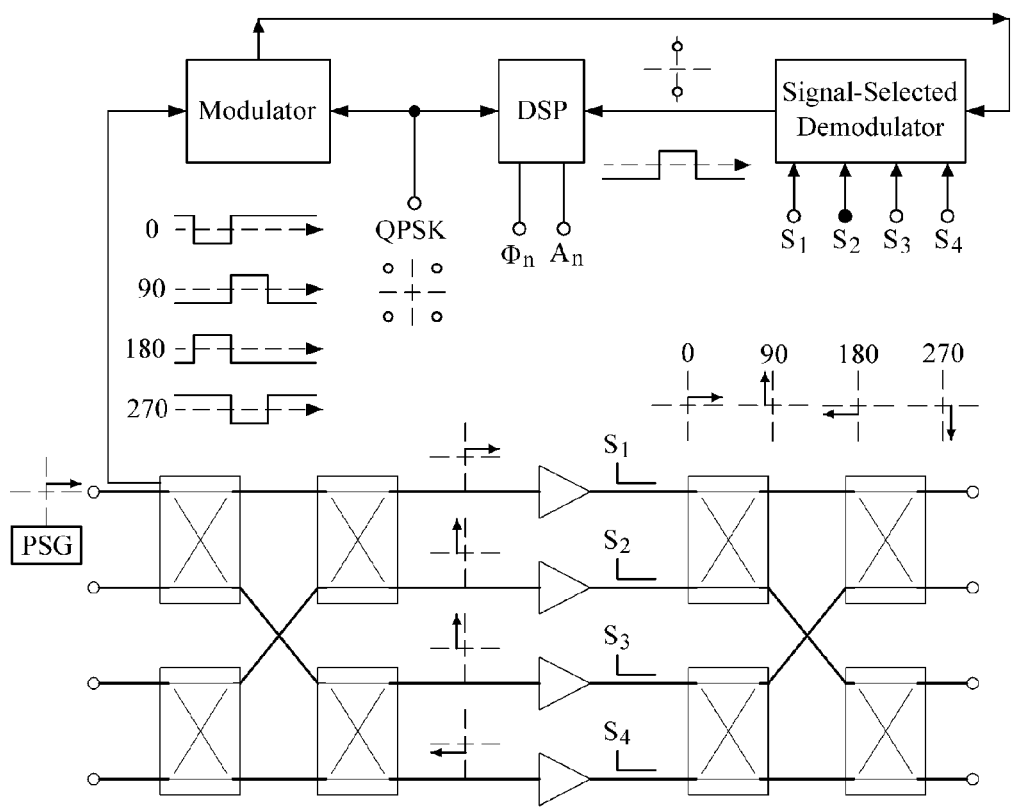
FIG. 9 is a time domain graph showing results of an output node when specific phases of 0°, 90°, 180°, and 270° are applied through a switch by the signal-selected demodulator according to the exemplary embodiment of the present invention.
Figure 10A:
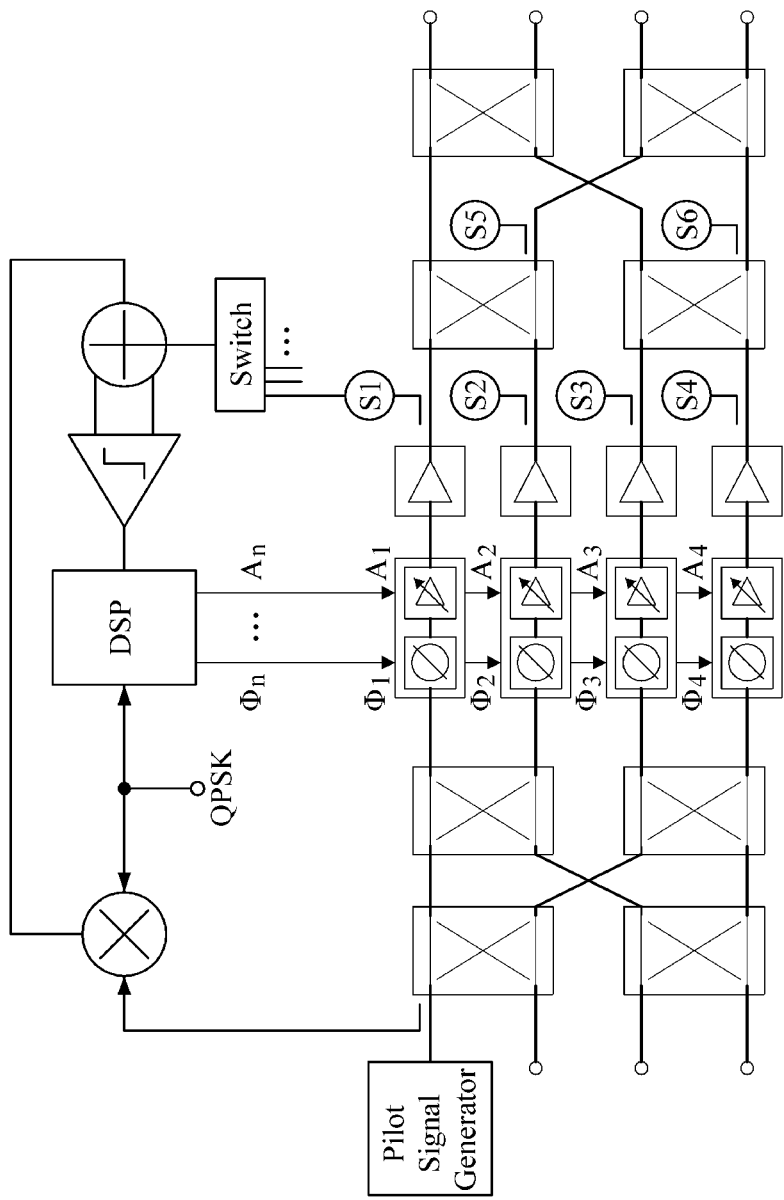
FIGS. 10A through 10D are diagrams of a multiport amplifier in which a signal-selected demodulator measures a time domain showing results of an output node through a switch according to an exemplary embodiment of the present invention.
Figure 10B:
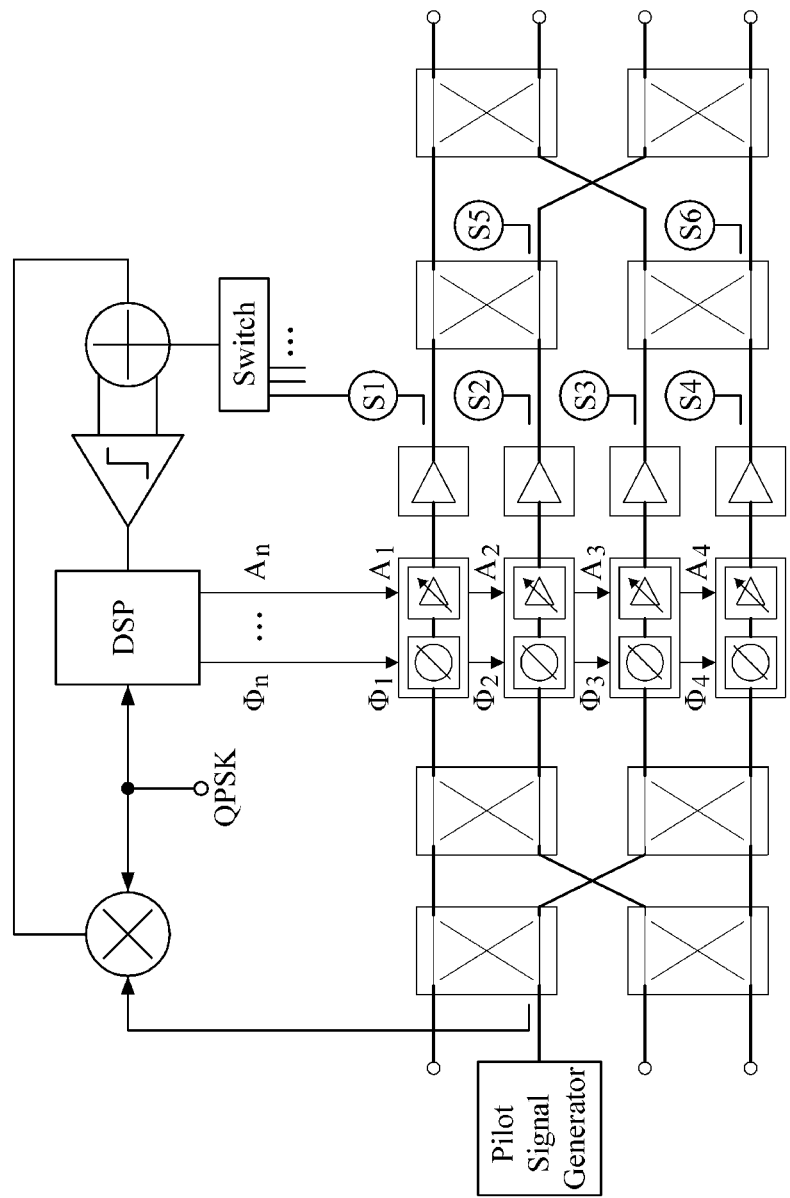
Figure 10C:
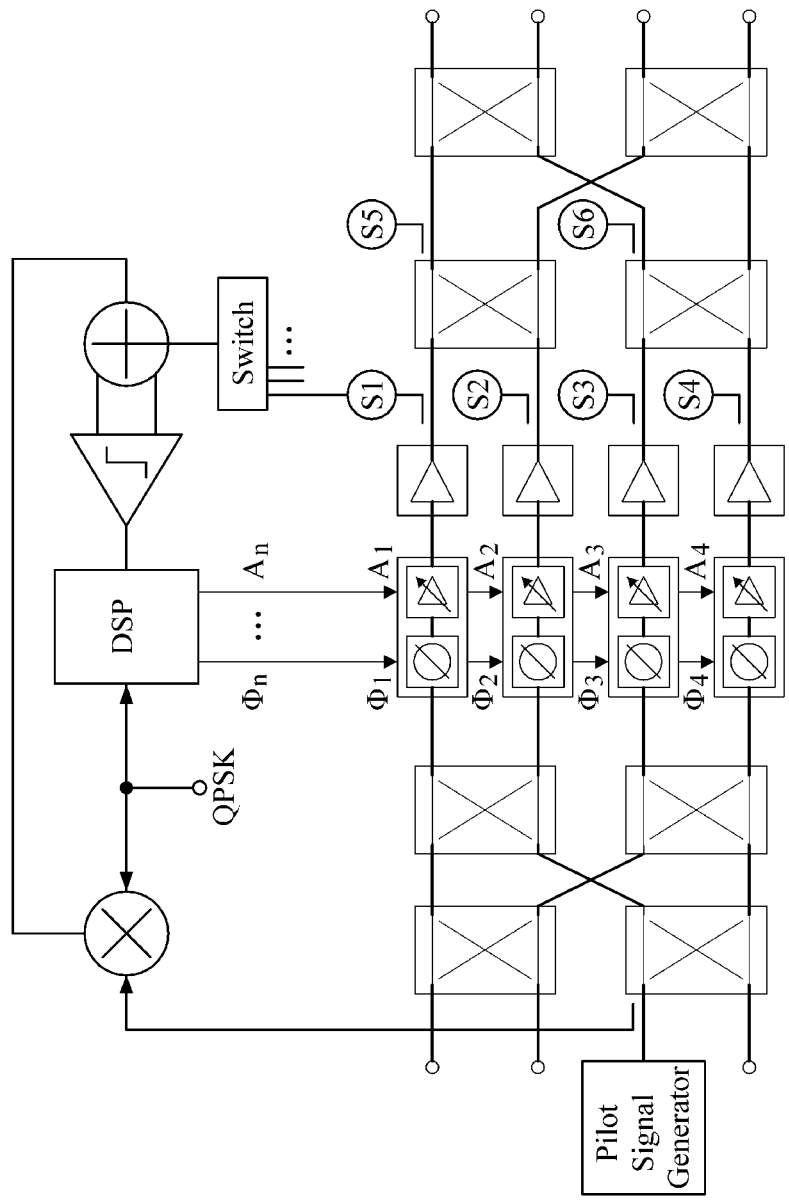
Figure 10D:
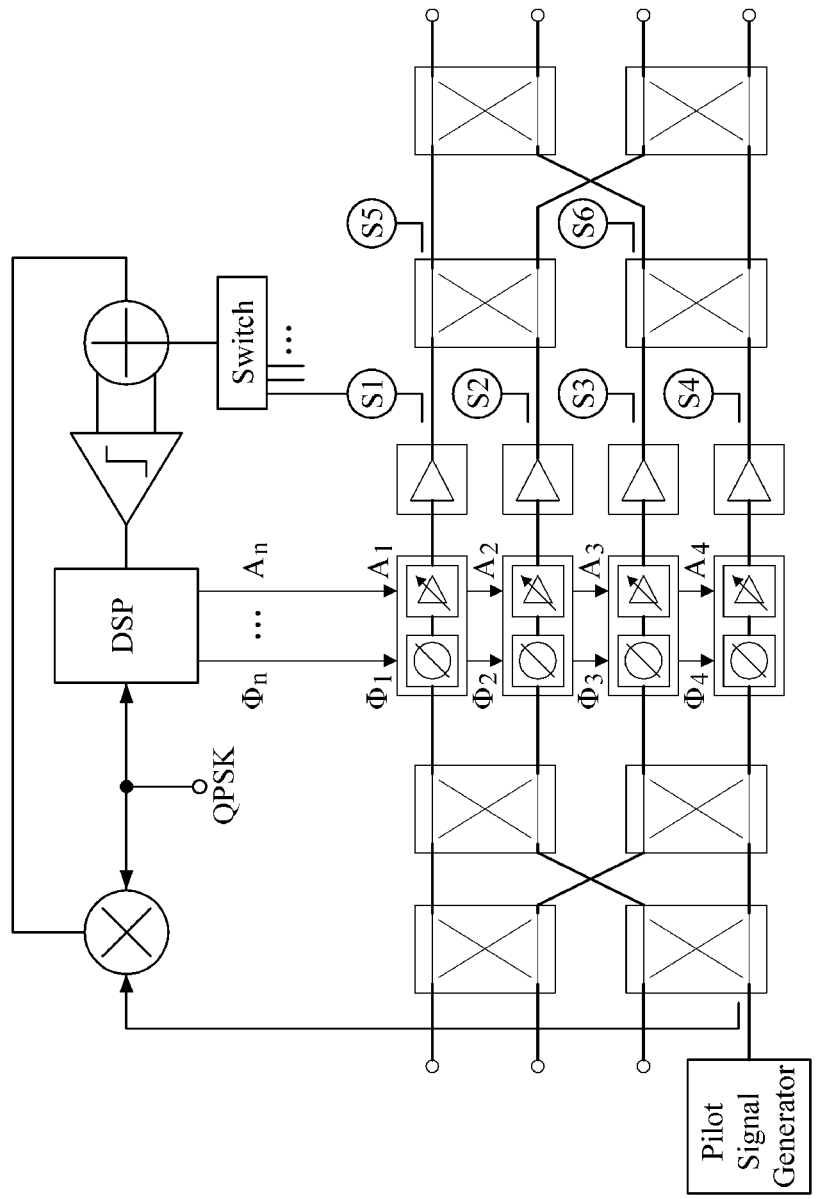

FIG. 9 is a time domain graph showing results of an output node when specific phases of 0°, 90°, 180°, and 270° are applied through a switch by the signal-selected demodulator according to the exemplary embodiment of the present invention.

FIG. 9 shows a demodulation signal applied to a DSP when a signal is applied to an input port I1, and a signal S2 is received during a calibration process.

Specifically, FIG. 9 shows a time domain curve showing results of an output node 607 when signals having specific phases of 0°, 90°, 180°, and 270° are applied from the signal-selected demodulator 550 through the switch 620.

Referring to FIG. 9, it can be seen that when a phase of the signal S2 is selected out of phases of selected LO signals by the switch 620, only data equal to a signal having a phase of 90° out of the QPSK signal is recovered. When a specific phase error occurs in input signals, the magnitude of the signals may be reduced, or data may be distorted as denoted by a solid line of FIG. 11. A detailed description thereof will be presented below with reference to FIG. 11.

The QPSK signal (both I and Q signals) may be carried by an RF frequency and modulated by the QPSK modulator 520, and a modulation signal may be applied to the signal-selected demodulator 550. However, since the signal input to the signal-selected demodulator 550 is applied through only one path by the switch 620 instead of two paths corresponding to the two signals (i.e., I and Q signals), the output signal may be determined by the phase of the LO signal applied to the node 602.

Since the phase of the signal applied to the node 602 is known, a signal output from the node 607 may be predicted out of the QPSK signal. Accordingly, the predicted signal may be compared with a signal actually output from the node 607 to perform a phase calibration operation.

FIGS. 10A through 10D are diagrams of a multiport amplifier in which a signal-selected demodulator measures a time domain showing results of an output node through a switch according to an exemplary embodiment of the present invention.

As explained above with reference to FIGS. 3A through 3D, the input and output ports of the multiport amplifier may make a pair, and signal paths may be predicted. Accordingly, the signal-selected demodulator may receive a signal from paths of all signals output by a high-power amplifier, and compensate a phase and amplitude of the received signal.

Thus, since signals 51 through S6 should be switched and received by the signal-selected demodulator, FIGS. 10A through 10D show that the signal-selected demodulator receives the signals 51 through S6 in different positions from the paths of all the signals output according to respective input ports.

All the signals 51 through S6 should be sequentially input to the signal-selected demodulator. Initial signals output by respective output nodes are signals whose phases and amplitudes are not yet calibrated. Also, respective phase and amplitude mismatches may be errors caused on the paths before the signals 51 through S6 are output. Accordingly, a signal closest to an input signal, a signal second closet to the input signal, . . . , and a signal farthest from the input signal may be sequentially calibrated.

Figure 11:
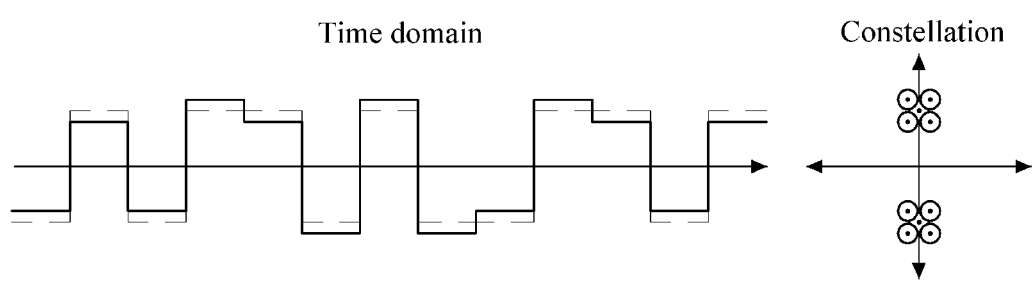
FIG. 11 is a diagram showing a process of calibrating a phase based on a time domain graph showing results of an output node according to an exemplary embodiment of the present invention.

FIG. 11 is a diagram of a process of calibrating a phase based on a time domain graph showing results of an output node according to an exemplary embodiment of the present invention.

In FIGS. 10A through 10D, the output signals 51 through S6 may have fixed phases. Also, the phases and amplitudes of the signals 51 through S6 may be sequentially calibrated. Accordingly, since a determined signal is to be output (as denoted by a dotted line) during calibration of the signal S1, the DSP 540 may compare the output signal with a predicted signal out of a QPSK signal, and control the phase of output signal until a desired signal is output.

When the phase of the output signal is not calibrated, the signal of the output node 607 may be output as shown in FIG. 11. The phase of the signal may be calibrated until the solid line is equalized to the dotted line.

Elements, features, and structures are denoted by the same reference numerals throughout the drawings and the detailed description, and the size and proportions of some elements may be exaggerated in the drawings for clarity and convenience.

The present invention can be implemented as computer readable codes in a computer readable record medium. Program codes and code segments constructing the above-described program may be easily inferred by a skilled computer programmer in the art. The computer readable record medium includes all types of record media in which computer readable data is stored. Examples of the computer readable record medium include a ROM, a RAM, a CD-ROM, a magnetic tape, a floppy disk, and an optical data storage. Further, the record medium may be implemented in the form of a carrier wave such as Internet transmission. In addition, the computer readable record medium may be distributed to computer systems over a network, in which computer readable codes may be stored and executed in a distributed manner.

As apparent from the above description, the present invention provides a circuit for and method of determining phase/amplitude adjusting values in a multiport amplifier, and a multiport amplifier having an auto-calibration function.

In addition, the present invention provides a multiport amplifier capable of automatically calibrating phase and amplitude mismatches in circuit configuration and environment.

Furthermore, the present invention provides a multiport amplifier including a small-sized, low-power auto-calibrating circuit.

It will be apparent to those of ordinary skill in the art that various modifications can be made to the exemplary embodiments of the invention described above. However, as long as modifications fall within the scope of the appended claims and their equivalents, they should not be misconstrued as a departure from the scope of the invention itself.

What is claimed is:

1. A multiport amplifier configured to control output power of a multi-beam antenna system, comprising:
   a magnitude/phase adjusting circuit configured to adjust a magnitude of a signal and an error in phase caused by nonlinearity of an input or output hybrid network constituting the multiport amplifier; and
   a calibrating circuit configured to control the magnitude/phase adjusting circuit by comparing a predicted output signal with a demodulated output signal of the magnitude/phase adjusting circuit, and transmitting a control signal based on the comparing to the magnitude/phase adjusting circuit.

2. A multiport amplifier configured to control output power of a multi-beam antenna system, comprising:
   a magnitude/phase adjusting circuit configured to adjust a magnitude of a signal and an error in phase caused by nonlinearity of an input or output hybrid network constituting the multiport amplifier; and
   a calibrating circuit configured to control the magnitude/phase adjusting circuit such that a magnitude and phase of a signal actually output by each of output ports of the multiport amplifier are equal to a magnitude and phase of a signal output by each of the output ports, which is predicted from an input signal input to a specific input port of the multiport amplifier;

wherein the calibrating circuit comprises:
a quadrature phase shift keying (QPSK) modulator configured to modulate a pilot signal into a QPSK signal;
a signal-selected demodulator configured to combine the modulated QPSK signal and the signal output by each of the output ports, and output a demodulation signal; and
a signal processor configured to compare the output signal predicted from the input signal with the demodulated output signal, and transmit a control signal by which the magnitude/phase adjusting circuit adjusts the magnitude and phase of the demodulated output signal.

3. The multiport amplifier of claim 2, wherein the QPSK demodulator modulates a pilot signal input to the input port into a QPSK signal including I and Q signals, and transmits the modulated QPSK signal to the signal-selected demodulator.

4. The multiport amplifier of claim 2, wherein the signal-selected demodulator comprises:
a switch configured to sequentially switch the output signal output by each of the output ports;
a signal coupler configured to shift the switched output signal in phase, and couple the modulated QPSK signal with the phase-shifted switched output signal; and
a comparator configured to compare the modulated QPSK signal with the phase-shifted switched output signal, and output a difference signal corresponding to a difference between the two signals.

5. The multiport amplifier of claim 4, wherein the switch switches an output signal sequentially having a predetermined phase with respect to the output signal output by each of the output ports.

6. The multiport amplifier of claim 4, wherein when the input signal is input to the specific input port of the multiport amplifier, the switch receives at least one signal from a transmission path of the predicted output signal over the output hybrid network, and switches the received signal according to a phase of the received signal.

7. The multiport amplifier of claim 6, wherein when the multiport amplifier includes four input ports and four output ports, the switch receives six signals from the transmission path of the output signal over the output hybrid network, and switches the received six signals according to phases of the received six signals.

8. The multiport amplifier of claim 4, wherein the signal coupler comprises:
a first coupler configured to couple the modulated QPSK signal with the switched output signal;
a phase shifter configured to invert a phase of the switched output signal by +180°; and
a second coupler configured to couple the modulated QPSK signal with the output signal shifted in phase by the phase shifter.

9. The multiport amplifier of claim 8, wherein the signal coupler comprises a rat-race coupler including:
a first port to which the modulated QPSK signal is input;
a second port to which the switched output signal is input;
a third port from which a signal generated by the first coupler is output; and
a fourth port from which a signal generated by the second coupler is output.

10. The multiport amplifier of claim 8, further comprising:
a power detector configured to detect power of each of a signal generated by the first coupler and a signal generated by the second coupler, and generate power signals; and
a filter unit configured to remove a harmonic component and noise of the generated power signal.

11. The multiport amplifier of claim 10, wherein the comparator compares the power signal of the signal generated by the first coupler with the power signal of the signal generated by the second coupler, and outputs a difference signal corresponding to a difference between the two power signals.

12. The multiport amplifier of claim 4, wherein the signal processor generates a control signal by which the magnitude/phase adjusting circuit adjusts the magnitude and phase of the difference signal based on the output signal predicted from the input signal, and transmits the control signal to the magnitude/phase adjusting circuit.

13. The multiport amplifier of claim 6, wherein the signal processor generates a control signal by which a magnitude and phase of the difference signal corresponding to each of the signals received by the switch are adjusted, and transmits the control signal to the magnitude/phase adjusting circuit.

14. The multiport amplifier of claim 7, wherein the signal processor generates a control signal by which a magnitude and phase of the difference signal corresponding to each of the six signals received by the switch are adjusted, and transmits the control signal to the magnitude/phase adjusting circuit.

15. The multiport amplifier of claim 12, wherein the magnitude/phase adjusting circuit adjusts the magnitude and phase of the difference signal in response to the received control signal.

16. A multiport amplification method using a multiport amplifier configured to control output power in a multi-beam antenna system, the method comprising:
modulating a pilot signal input to a specific input port of the multiport amplifier into a QPSK signal including I and Q signals;
sequentially switching output signals output by respective output ports of the multiport amplifier;
coupling the modulated QPSK signal with the switched output signal;
coupling the modulated QPSK signal with an output signal obtained by inverting the switched output signal in phase by +180°;
comparing the two coupled signals to output a difference signal corresponding to a difference between the compared signals; and
adjusting a magnitude and phase of the difference signal based on an output signal predicted from the input pilot signal.

17. The method of claim 16, wherein when an input signal is input to a specific input port of the multiport amplifier, each step is repeatedly performed on at least one signal output from a transmission path of the predicted output signal over an output hybrid network.

* * * * *